United States Patent [19]
Elliott et al.

[11] Patent Number: 5,771,260
[45] Date of Patent: Jun. 23, 1998

[54] ENCLOSURE SYSTEM FOR LASER OPTICAL SYSTEMS AND DEVICES

[75] Inventors: David J. Elliott, Wayland; Jonathan C. Camp, Bedford; Warren C. Harlow, Franklin, all of Mass.

[73] Assignee: Excimer Laser Systems, Inc., Wayland, Mass.

[21] Appl. No.: 725,878

[22] Filed: Oct. 4, 1996

[51] Int. Cl.$^6$ .................................................. H01S 3/08
[52] U.S. Cl. ............................................. 372/109; 372/55
[58] Field of Search ................................ 372/109, 55, 92, 372/58, 61, 98, 101, 103, 107, 108

[56] References Cited

U.S. PATENT DOCUMENTS

4,774,714  9/1988  Javan ........................................ 372/109
4,912,718  3/1990  Klingel ....................................... 372/94

*Primary Examiner*—James W. Davie
*Attorney, Agent, or Firm*—Iandiorio & Teska

[57] ABSTRACT

An enclosure system for optical laser devices including a set of sealable and reconfigurable modules housing optical devices and a set of interconnecting tubes for containing the laser beam. Each module includes at least one port; a universal mounting plate for mounting an optical device within the module; and at least one window for viewing the optical device. Each module and each interconnecting tube may include a gas fitting for purging the system with a gas. The modules are interchangeable and reconfigurable.

34 Claims, 8 Drawing Sheets

193nm Enclosed Beamline Test Data: Nitrogen Purge Gas
50 Hz Test

| Time (Min) | No Purge | 5 psi-N2 | 10 psi-N2 |
|---|---|---|---|
| 0 | 4.06 | 4.11 | 9.07 |
| 1 | 4.08 | 5.58 | 9.09 |
| 2 | 4.06 | 7.11 | 9.14 |
| 3 | 4.09 | 8.16 | 9.20 |
| 4 | 4.11 | 8.36 | 9.20 |
| 5 | 4.11 | 8.57 | 9.24 |
| 6 | 4.09 | 8.71 | 9.30 |
| 7 | 4.09 | 8.79 | 9.31 |
| 8 | 4.09 | 8.91 | 9.28 |
| 9 | 4.11 | 8.94 | 9.37 |
| 10 | 4.09 | 9.01 | 9.35 |
| 11 | 4.11 | 9.05 | 9.37 |
| 12 | 4.11 | 9.07 | 9.39 |

Test Conditions

| | |
|---|---|
| Laser | Cymer CX-2, Unnarrowed |
| Laser Gas | 0.12% F2, 2.8% Ar, Bal. Neon |
| Pathlength | 2083mm (82 inches) |
| Path Optics | 192nm mirrors (4); Supersil 1 lenses (2) |
| Metrology Tools | Molectron Joulemeter-J25LP-1 head; Ophir Nova Energy Monitor |
| Ozone Detector | InUSA IN-2000 UV Ozone Analyzer |

FIG. 7

| 200 Hz Test | | |
|---|---|---|
| No Purge | 5 psi-N2 | 10 psi-N2 |
| 2.85 | 2.62 | 8.38 |
| 2.83 | 5.47 | 8.29 |
| 2.84 | 7.39 | 8.36 |
| 2.85 | 7.68 | 8.42 |
| 2.57 | 7.91 | 8.43 |
| 2.60 | 8.02 | 8.42 |
| 2.61 | 8.12 | 8.43 |
| 2.61 | 8.23 | 8.36 |
| 2.63 | 8.25 | 8.45 |
| 2.59 | 8.31 | 8.43 |
| 2.63 | 8.33 | 8.34 |
| 2.60 | 8.34 | 8.36 |
| 2.62 | 8.38 | 8.36 |

FIG. 8

ENCLOSURE SYSTEM FOR LASER OPTICAL SYSTEMS AND DEVICES

FIELD OF INVENTION

This invention relates to an enclosure system with interchangeable and reconfigurable components for optical laser devices which prevents the contamination of the optical devices, prevents the formation of toxic ozone, increases laser energy levels, reduces exposure to ultraviolet radiation, and facilitates visual inspection of the laser beam and the related optical components.

BACKGROUND OF INVENTION

Ultraviolet lasers, previously examiner lasers, have only recently been produced as industrial products suitable for volume manufacturing applications. As a result, their usage is increasing, along with the need for safer and more efficient optical paths to deliver the ultraviolet energy to a work surface. The high power of the short wavelength (157–308 nm) ultraviolet photons makes this technology useful for a variety of applications in medicine, semiconductor fabrication, and manufacturing of micromechanical devices. Typical optical devices associated with ultraviolet laser systems include beam splitter mirrors, homogenizer optical devices, apertured optical devices, lenses, and the like.

There are six primary problems associated with prior art ultraviolet laser systems. The first problem relates to formation of ozone. In research and manufacturing, ultraviolet laser beams are directed along relatively long optical paths or "beamlines" where they interact with air to form ozone, a human health hazard. The typical concentration of ozone in nature, at ground level, is 0.03 ppm. The OSHA eight hour human exposure limit for ozone is 0.1 ppm; the OSHA short term exposure limit for ozone is 0.3 ppm. Above 0.3 ppm, there is a risk of damage to respiratory tissues, and long term exposure to concentrations above 1 ppm can cause irreparable damage and even death. Concentrations above the toxic limit are generated in a typical beamline within three to four minutes of firing a deep-UV laser; within 10 minutes, ozone levels typically exceed the toxic limit by 50 to 100 times.

The second problem associated with prior art ultraviolet laser systems is contamination of the optical devices. The interaction of the ultraviolet laser beam with air produces by-products from the breakdown of elements in the air which deposit unwanted films on the laser optics causing serious energy losses in the beam. In addition, it is very difficult to clean an ultraviolet laser mirror lens without creating microscratches, leaving residues behind, or damaging the anti-reflection coating.

The third problem relates to energy losses in the ultraviolet laser beam. When the ultraviolet laser beam interacts with air, the losses are significant. For example, an ultraviolet laser with an output of 600 mJ will be reduced to less than 30 mJ by interacting with the air along a seven foot long optical path. Ultraviolet lasers and optical delivery systems are very expensive and transmission efficiencies run typically in the 2–10% range, measuring from the laser to the wafer or workpiece. For example, a laser wafer stepper used to print integrated circuit chips has a laser-to-wafer loss of 97% so that out of 100 mJ measured at the beginning, only 3 mJ end up as useful energy, the balance lost by absorption in the air, the optics, and reflection losses from optical surfaces.

The fourth problem associated with the prior art relates to human exposure to ultraviolet radiation. Ultraviolet laser pulses are extremely intense and can instantly ablate human tissue and cause severe burns. Many companies insist that operators and technicians wear special eye and skin protection and require electric interlocks on all access doors. These safeguards are both cumbersome and costly.

The fifth problem associated with prior art systems is the limited visual access to the ultraviolet laser beam and the optical components. Some prior art systems incorporate opaque metal tubes to enclose the beamline, but this technique is often avoided because it is difficult to implement, and it eliminates the chance of viewing the beam while it is being fired through the system. Visual access to the beam itself and the optical components is critical in order to make sure the beam is properly aligned, to diagnose the beam quality, and to take measurements.

The sixth problem associated with prior ultraviolet laser systems is that any enclosure design for one system is typically unique and therefore not useful for different kinds of laser systems. That is, prior enclosures are not reconfigurable or interchangeable.

SUMMARY OF INVENTION

It is therefore an object of this invention to provide an enclosure system for optical laser devices.

It is a further object of this invention to provide such an enclosure system for optical laser devices which prevents contamination of the optics housed within the enclosure system.

It is a further object of this invention to provide such an enclosure system for optical laser devices which prevents the formation of toxic ozone.

It is a further object of this invention to provide such an enclosure system for optical laser devices which increases the ultraviolet laser energy level.

It is a further object of this invention to provide such an enclosure system for optical laser device which reduces human exposure to ultraviolet radiation.

It is a further object of this invention to provide such an enclosure system for optical laser devices which facilitates visual access to and inspection of the ultraviolet laser beam and the optical components housed within the enclosure system for beam alignment, diagnosis, and measurement.

It is a further object of this invention to provide such an enclosure system for optical laser devices which is both reconfigurable and interchangeable and thus adaptable to a wide variety of laser systems and associated optical components.

This invention results from the realization that the formation of toxic ozone can be eliminated, that the contamination of laser optical devices can be prevented, that the energy level of a laser beam can be increased, and that the exposure to ultraviolet radiation can be reduced through the use of interconnected sealed modules which house the optical components of a laser system and interconnecting laser beam tubes and that such modules and tubes, if made interchangeable and reconfigurable, can be used universally regardless of the path of the laser beam of a particular laser system. Since the individual modules are sealable, they eliminate the formation of toxic ozone and they can be purged with gas to increase the output level of the laser beam and also prevent airborne contaminants from contaminating the optical components. Since the modules are made of interchangeable components, they can accommodate any laser system configuration regardless of the path of the laser beam. In addition, the connecting tubes are made of clear plastic and the modules are fabricated, in part, by the use of clear plastic plates thus allowing visual access to the ultraviolet laser beam and the optical devices for beam alignment, beam monitoring, diagnosis, and for taking measurements.

This invention features an enclosure system for optical laser devices. There are a set of sealable modules each including at least one port; means for mounting an optical device within the module; and at least one window for viewing the optical device. There is also a set of module connecting devices sealable with respect to the ports of the modules for interconnecting the modules in a sealed fashion.

Each module preferably includes a plurality of reconfigurable frame members. One such module includes first and second opposing ports. In another configuration, the same module includes a first port disposed at a right angle with respect to the second port.

In the preferred embodiment, the modules are cubes and the ports include a circular collar with an O-ring for sealingly engaging the tubular module connecting devices. Both the tubes and the windows are typically constructed of a material transparent to white light and opaque to ultraviolet energy. Also, the windows and/or the tubes preferably include a fitting for gas purging the module.

This invention also features a sealable module for an optical laser device. There are a set of interchangeable plates and means for securing each plate to an adjacent plate thus forming a sealed module. One plate made of plastic includes a window for viewing components mounted within the module. One or more plates typically include a port for connecting one module to another module. One plate typically includes a fitting for gas purging the module. One plate includes means for mounting an optical device thereto within the module.

Each module includes a pair of spaced frame members; a set of legs interconnecting the frame members; a set of panels affixable to the frame members forming the walls of the module; and means for removably attaching the panels to the frame members to facilitate reconfiguration of the module. The means for attaching may include one set of fasteners receivable through the panels, through the frame members, and securable with respect to the leg members. Another set of fasteners are receivable through the panels and securable with respect to the frame members.

A complete system includes a set of modules, a set of connecting tubes, a source of purge gas, and a set of gas lines connectable to the modules and/or the connecting tubes.

DISCLOSURE OF PREFERRED EMBODIMENT

Other objects, features and advantages will occur to those skilled in the art from the following description of a preferred embodiment and the accompanying drawings, in which.

Figure 1:
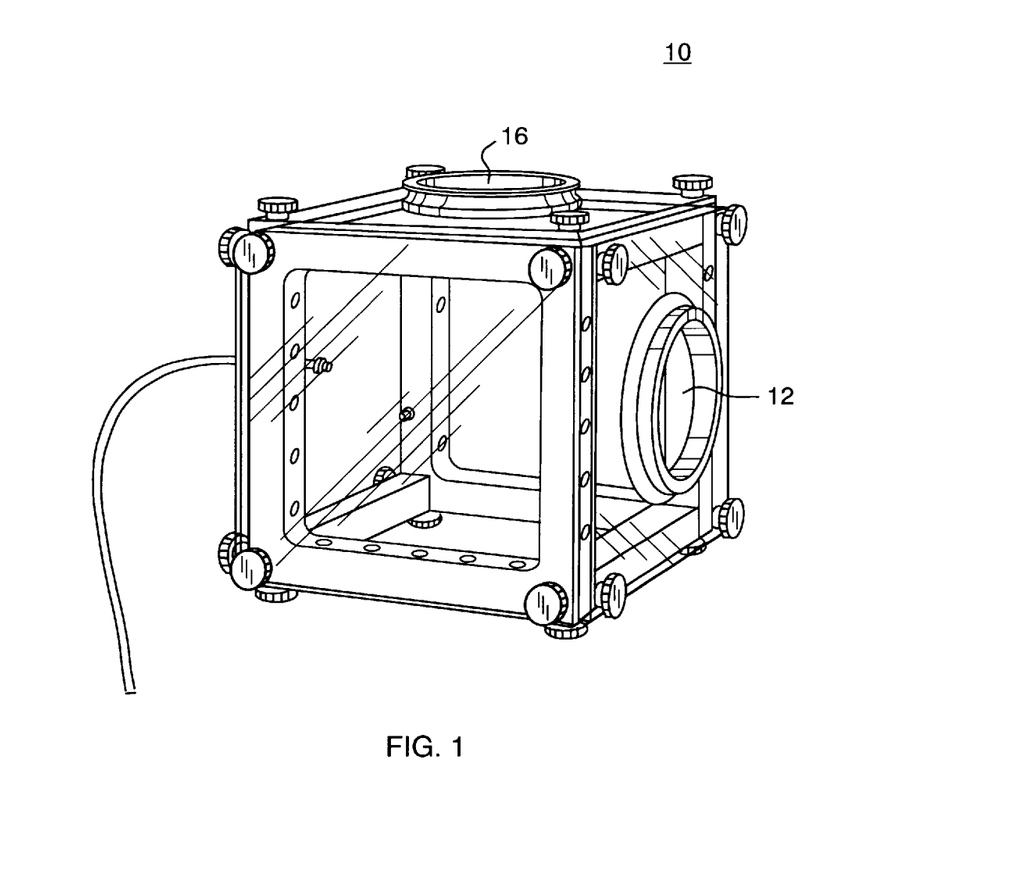
FIG. 1 schematic three-dimensional view of one configuration of a sealable module of the enclosure system for optical laser devices of this invention.

Reconfigurable and interchangeable sealable module 10, FIG. 1 of this invention includes port 12 and port 16 at right angles with respect to each other as shown thus forming an enclosure for a mirror or beam splitter type optical laser device to be housed within module 10. Module 20, FIG. 2, on the other hand, includes opposing ports 22 and 24 and thus module 20 houses a lens, a homogenizer type optical device, or an aperture type optical device. Modules 10 and 20 are typically square in shape with a width of between four to six inches depending on the specific implementation. Other shapes and modules of different sizes, however, may be used.

Figure 3:
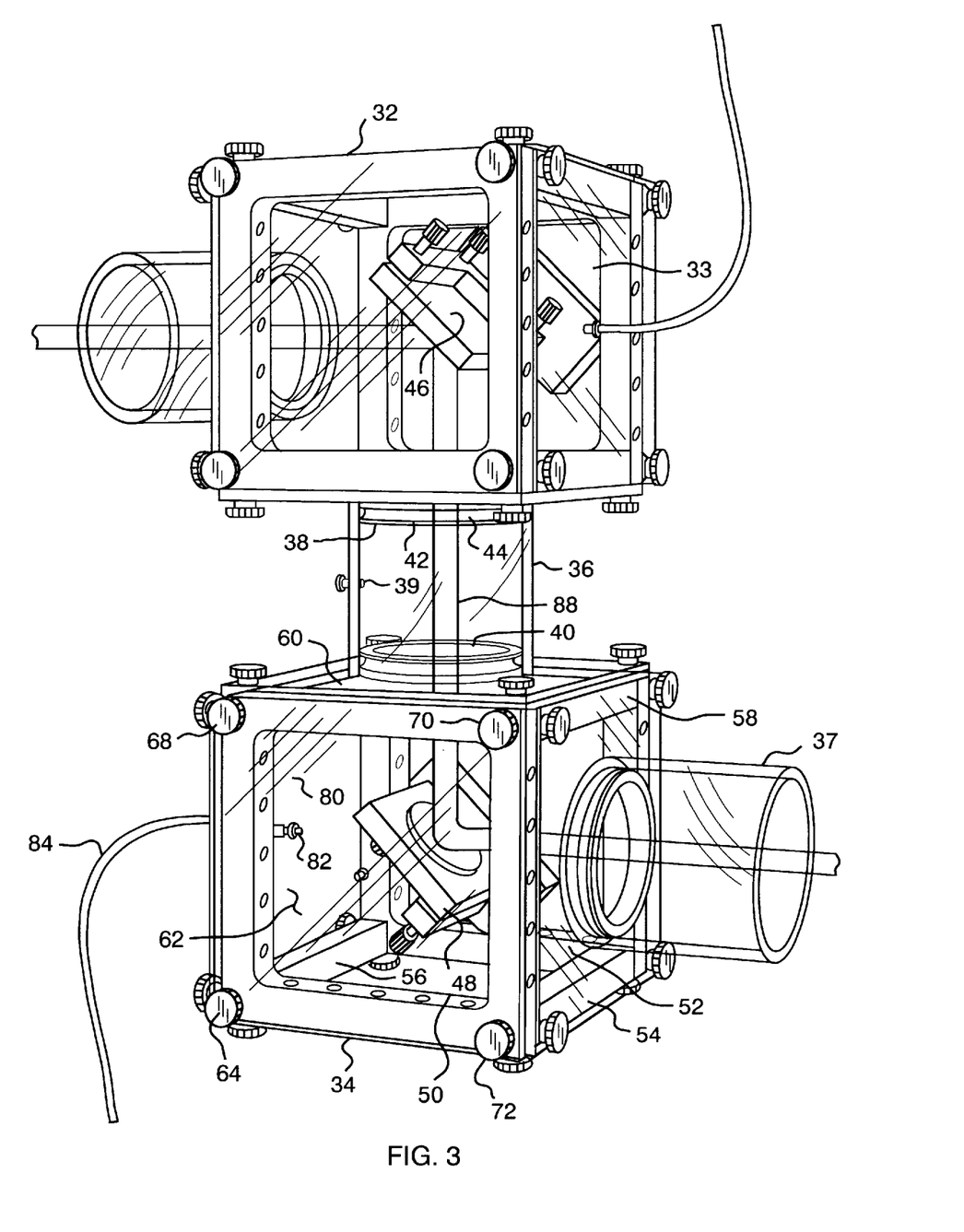
FIG. 3 is a three dimensional schematic view showing one embodiment of the enclosure system of this invention including two sealable modules and the module connecting devices of this invention.

The complete enclosure system 30, FIG. 3, of this invention includes one or more modules 32 and 34 and module connecting device 36 in the form of a clear acrylic plastic tube which is sealable with respect to port 38 of module 32 and port 40 of module 34. Module connecting device 36 thus interconnects modules 32 and 34 in a sealed fashion. Port 38 includes circular collar 42 with annular recess 44 which houses a rubber O-ring (not shown). Port 38 is approximately three to three and one-half inches in diameter.

Mirror mount 46, housed with in module 32, and mirror mount 48, housed within module 34, are examples of the various types of optical laser devices which may be sealably housed within the enclosure system 30 of this invention.

Module 34 includes spaced frame members 50 and 52 interconnected by legs 54, 56, 58, and 60. Clear acrylic panel 62 is affixed to frame member 50 through the use of screws 64, 68, 70, and 72 (e.g. ¼–20) each of which pass through clear acrylic panel 62, through frame member 50 and into legs 56, 60, 58, and 54, respectively. Thus, screws 64, 68, 70, and 72 perform the dual function of securing panel 62 to frame member 50 and securing legs 54, 56, 58, and 60 to frame member 50. Panel 80 is also made of a clear acrylic plastic material that has substantial transparency to white light and yet is substantially opaque to ultraviolet light. Thus, panel 80 allows technicians to visually inspect the interior of module 34. Panel 80 also includes fitting 82 connected to purge line 84 for purging the interior of module 34 with nitrogen or some other suitable gas. Panel 33 of module 32 is a universal mounting plate made of aluminum or plastic and is used to secure mirror mount 46 within module 32.

The result is a completely sealed system which prevents the contamination of optical devices mounted to mounts 46 and 48 by dirt and other contaminants. The sealed system also prevents the formation of toxic ozone and reduces exposure to ultraviolet radiation. Clear plates 62 and 80 allow visual access to laser beam 88 and to optical device 48 for inspection purposes. Connecting devices 36 and 37 are also preferably made of plastic to allow inspection of laser beam 88.

Figure 4:
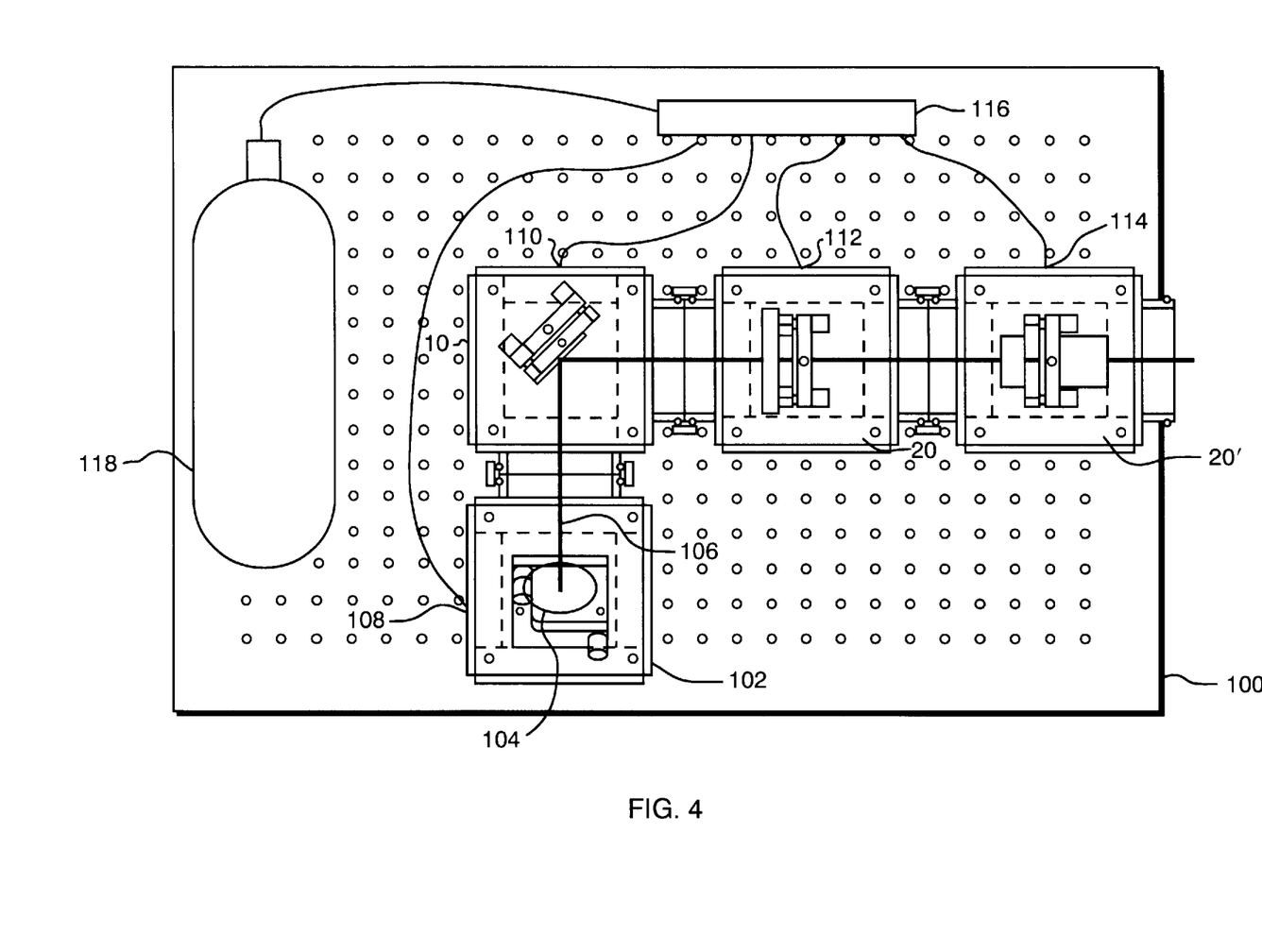
FIG. 4 is a top plan view of the enclosure system for optical laser devices of this invention in place on a standard laser breadboard and also including a nitrogen purging subsystem in accordance with this invention.

As discussed above, two other important features of the subject invention include the ability to purge the enclosure system with a gas and the interchangeable and reconfigurable nature of the individual components of the enclosure system. In FIG. 4, such a system according to this invention is mounted to laser breadboard 100 which includes a right angle type module 10 (also shown in FIG. 1) and two straight through modules 20 and 20'(also shown in FIG. 2). Module 102 is also a right angle module which houses beam splitting mirror 104 that redirects laser beam 106 out of the plane of the figure. Each such module includes gas fittings 108, 110, 112, and 114 connected to manifold 116 which itself is connected to gas source 118. Further included may be a charcoal/membrane filter (not shown) to remove organic and particulate contaminates from the purging gas. The filtered gas is delivered to manifold 116 and then dispensed by the delivery lines shown to fittings 108, 110, 112, and 114 threaded into the sides of the modules. The gas is turned on prior to firing the laser to purge air from the beam enclosure space. After a specified and precalculated period of time, the laser is fired. When the gas is turned on, at a typical pressure of 5–10 psi, it replaces the volume of air in the system with the purging gas, generally nitrogen. Argon, helium, custom mixes of argon and helium and nitrogen, and other gases and other gas mixtures may be used. The gas is regulated to flow at a slow rate to allow a positive pressure to exist in the system. This pressurized enclosure creates a blanket of gas around ultraviolet laser beam 106 and on the optical surfaces of the optical devices housed within each module. The gas or gases are also used as a conditioning medium for the laser beam. For example, it is possible to make very precise controllable changes in the ultraviolet laser beam intensity by simply changing the flow or pressure of the nitrogen in the system. The purging gas also eliminates the formation of toxic ozone and increases the ultraviolet energy of laser beam 106. One or more of the connecting tubes may also be fitted with a purge gas fitting as shown at 39 for connecting tube 36, FIG. 3.

Figure 2:
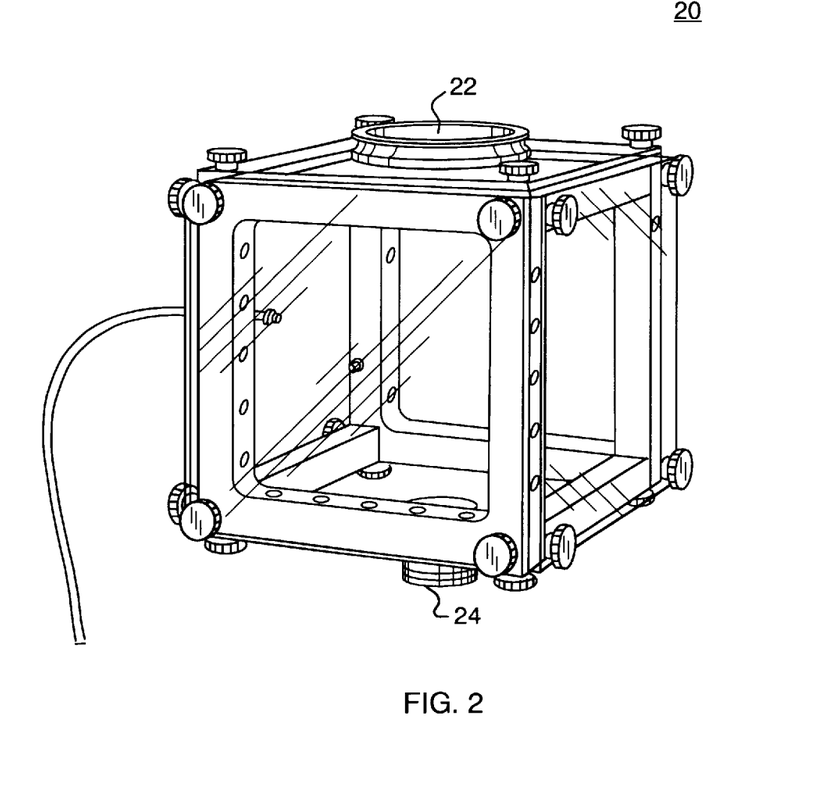
FIG. 2 is a three-dimensional schematic view of another configuration of a sealable module shown in FIG. 1.
Figure 5:
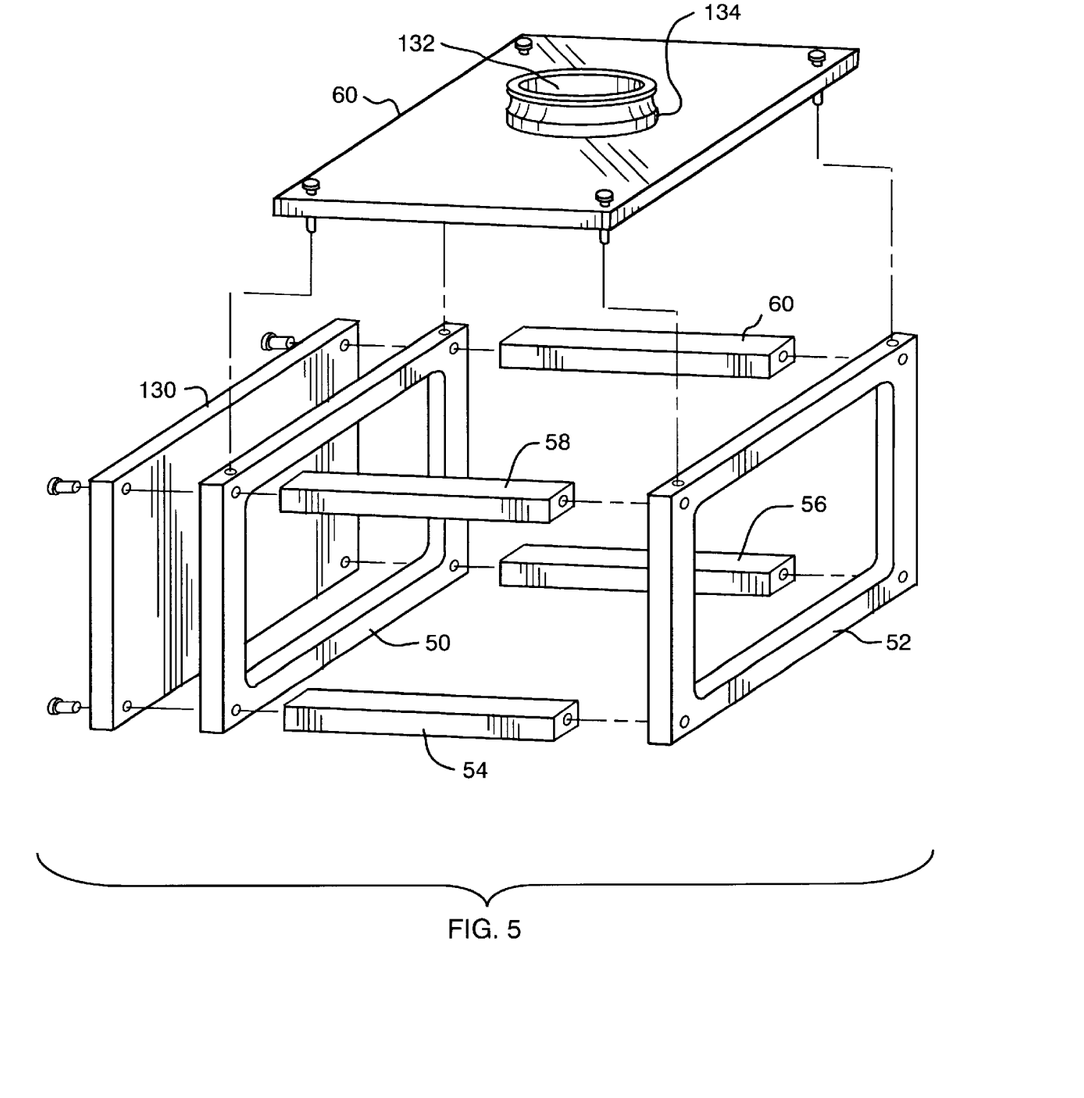
FIG. 5 is a schematic exploded view of a portion of one reconfigurable and interchangeable module of the enclosure system of this invention.

Another feature of the subject invention is the ability of an individual module 10, FIG. 1, and module 20, FIG. 2, for example, to be reconfigured. Each module includes frame members 50 and 52 and a set of leg members 54, 56, 58 and 60. Clear acrylic plate 60 can be attached to any side of the module and thus module 10, FIG. 1, can be easily changed into the configuration of module 20, FIG. 2. Plate 130, FIG. 5 could be a port type plate as shown for plate 60 including circular collar 132 and O-ring 134; a metal or plastic plate with a single gas line fitting screwed into the plate; a featureless glass or plastic plate, or a mounting plate for mounting optical components within the module.

Figure 6:
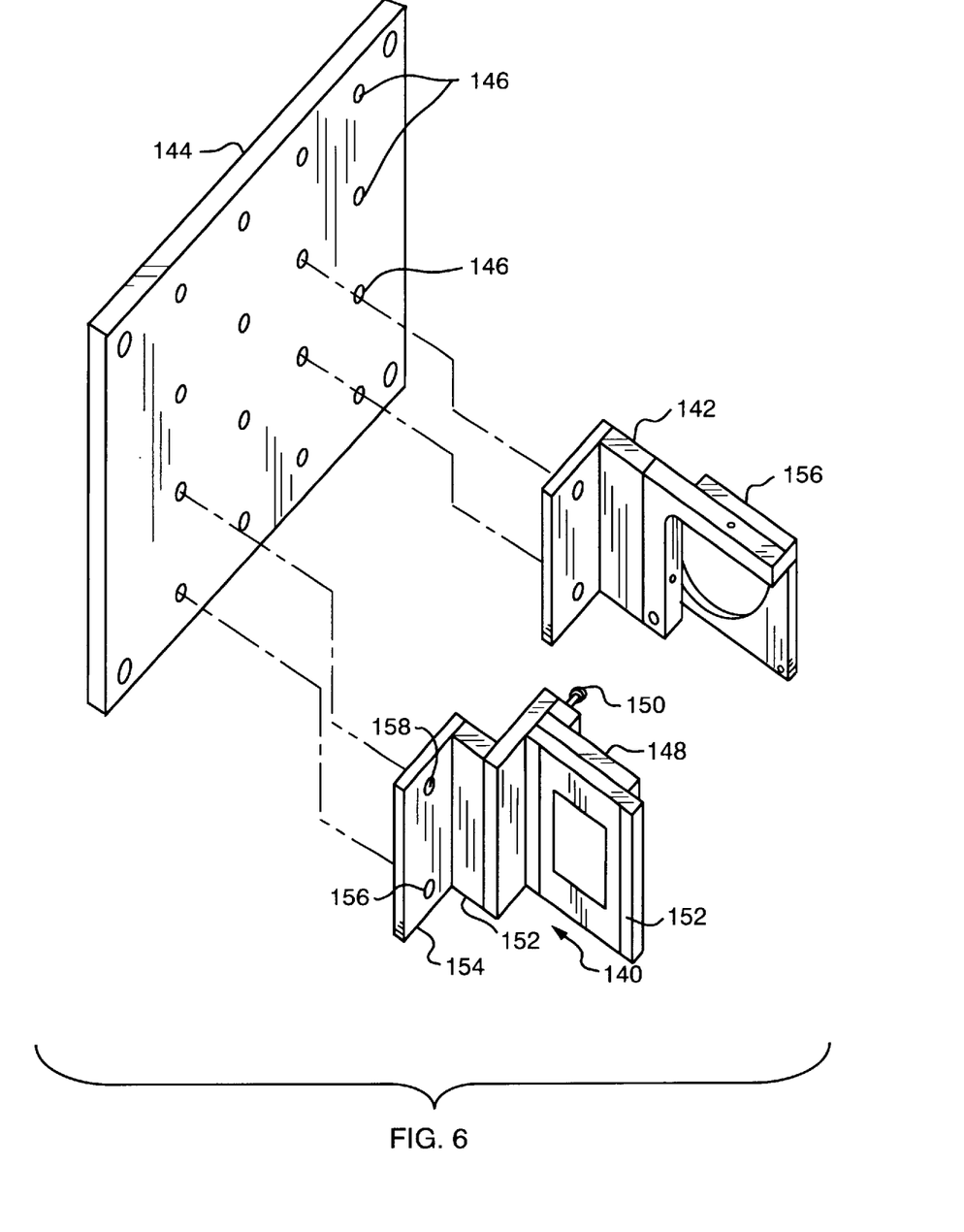
FIG. 6 is a schematic view of the universal mounting plate and two different optical component mounts forming a part of the enclosure system of this invention.

Such a mounting plate and two common optical mount devices 140 and 142 are shown in FIG. 6. Device 140 is a lens mount and device 142 is a mirror mount device for either a beam splitter mirror or a standard 45° mirror. Each device is mountable to aluminum or plastic universal mounting plate 144 which includes mounting holes 146 so that either device can be mounted horizontally, vertically or at any desired angle within the module (see FIGS. 3–4).

Device 140 includes a ThorLabs, Inc. (New Jersey) lens mount 148 or its equivalent and adjustment mechanism 150. Adaptor plate 152 allows a square shape lens to be mounted to mount 140. Spacer plate 152 attaches lens mount 148 to plate 154 which includes oval shaped mounting holes 156 and 158 which receive fasteners to affix plate 154 to universal mounting plate 144. Device 142 is constructed in a similar fashion except that it includes a ThorLabs, Inc. mirror mount 156.

Universal mounting plate 144 may be secured to any one of the four sides of the module or even the top or bottom of the module depending on the type of laser system, the specificate optical device to be housed within the module, and/or the desired path of the laser beam.

Figure 7:
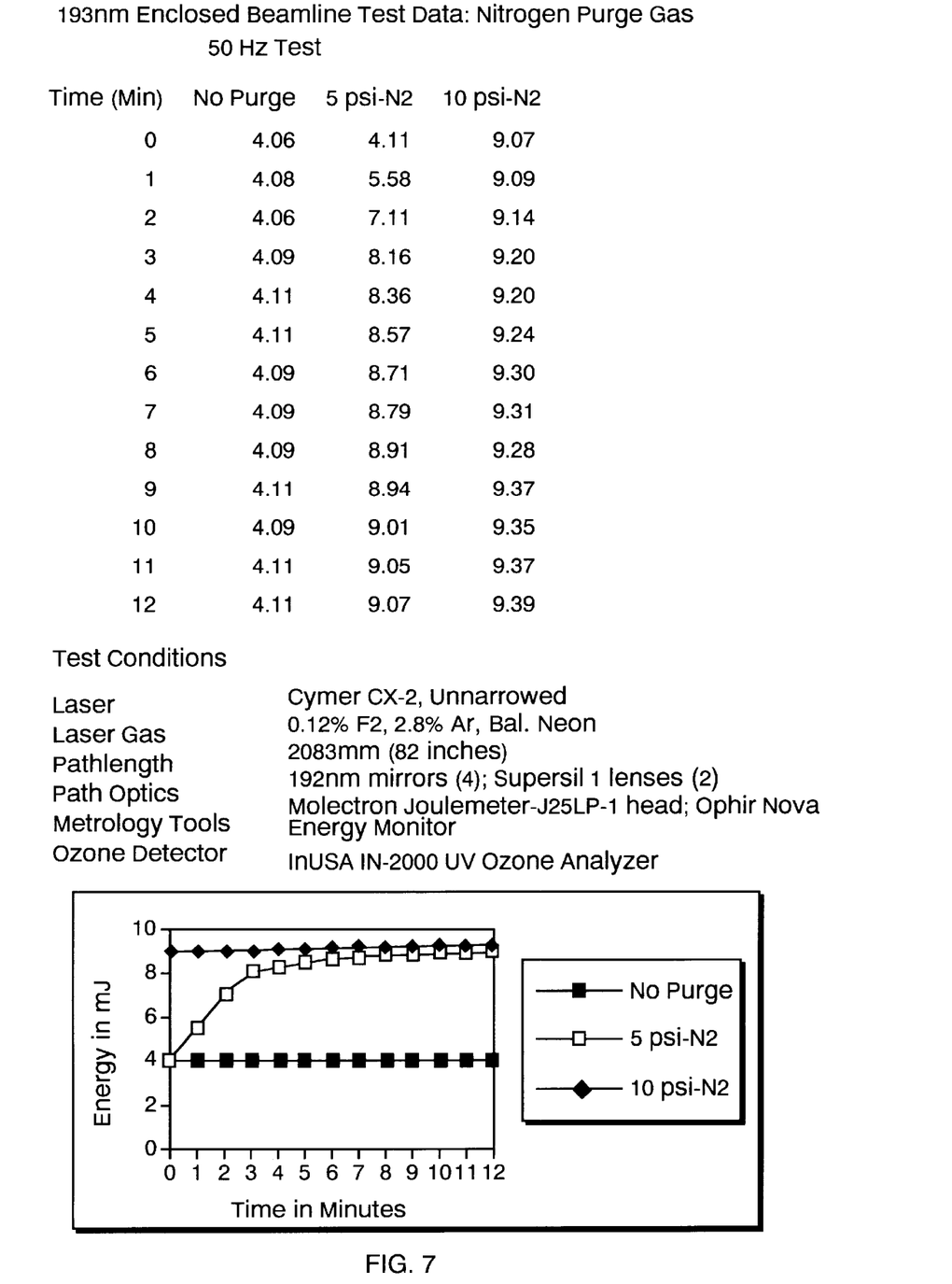
FIGS. 7 and 8 are graphs and experimental data depicting the laser energy increase as a result of using the enclosure system of this invention when the enclosure system is purged with a gas such as nitrogen.
Figure 8:
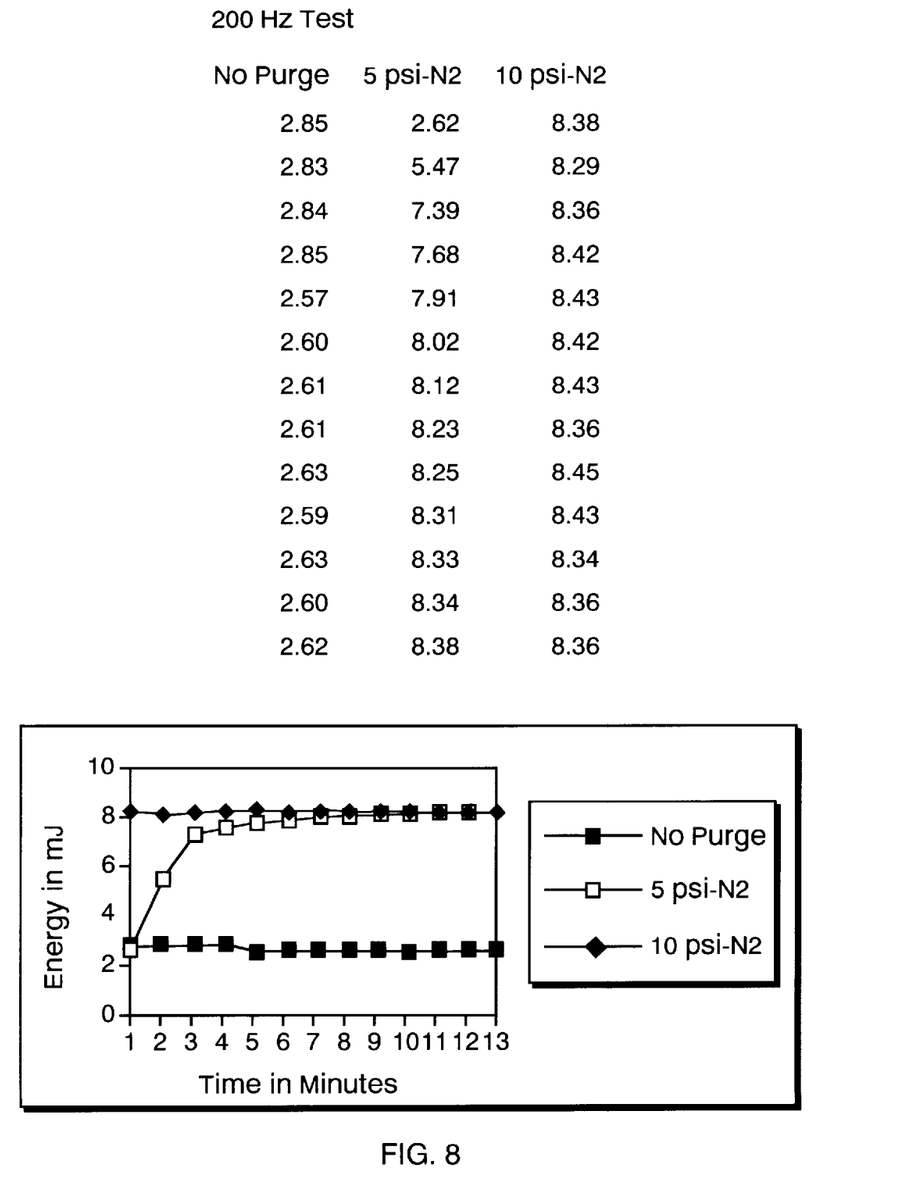

As shown in FIGS. 7 and 8, the ability to purge the individual modules and, if desired, connecting tubes 36 and 37, FIG. 3 with a gas leads to a beam intensity increase of between 50–200%. At 50 Hz, the energy level of a Cymer Cx-2 laser was increased from 4.11 mJ to 9.39 mJ at a gas purge pressure of 10 psi. At 200Hz, the energy level was increased from 2.6 mJ to 8.36 mJ.

Thus, the sealed, reconfigurable and interchangeable system shown in FIG. 3 decreases the formation of toxic ozone, reduces the contamination of laser optical devices, increases the energy level of the laser beam, and reduces exposure to ultraviolet radiation. The interconnected sealed modules which house the optical components of a laser system are interchangeable and reconfigurable and thus can be used universally regardless of the path of the laser beam or the particular type of laser optic system. The individual modules are sealable, they eliminate the formation of toxic ozone, and they can be purged with gas to increase the output level of the laser beam and also prevent airborne contaminants from contaminating the optical components. Since the modules are made of interchangeable components, they can accommodate any type of laser system regardless of the path of the laser beam. In addition, the modules are fabricated, in part, by the use of clear plastic plates thus allowing visual access to the ultraviolet laser beam and the optical devices for beam alignment, beam monitoring, diagnosis, and for taking measurements. The universal mounting plate and the optical mount devices allow optical devices to be mounted in a variety of ways within each module.

Although specific features of this invention are shown in some drawings and not others, this is for convenience only as each feature may be combined with any or all of the other features in accordance with the invention. For example, the invention described herein may be used with non-ultraviolet laser systems and devices.

Other embodiments will occur to those skilled in the art and are within the following claims:

What is claimed is:

1. An enclosure system for optical laser devices comprising:
    a set of sealable modules each said module including:
        at least one port;
        means for mounting an optical device within said module, and
        at least one window for viewing said optical device; and
    a set of module connecting devices sealable with respect to the ports of the modules for sealingly interconnecting said modules.

2. The enclosure system of claim 1 wherein each module includes a plurality of reconfigurable frame members.

3. The enclosure system of claim 1 in which a said module includes first and second opposing ports on opposite sides of said module.

4. The enclosure system of claim 1 in which a said module includes first and second ports, the first said port disposed at a right angle with respect to the second said port.

5. The enclosure system of claim 1 in which said modules are cubes.

6. The enclosure system of claim 1 in which said ports include a circular collar including an O-ring for sealingly engaging said module connecting devices.

7. The enclosure system of claim 1 in which said module connecting devices are tubes.

8. The enclosure system of claim 1 in which said module connecting devices are constructed of a material transparent to white light and opaque to ultraviolet energy.

9. The enclosure system of claim 1 in which said window is constructed of a material transparent to white light and opaque to ultraviolet energy.

10. The enclosure system of claim 1 in which at least one said module further includes a fitting for gas purging the module.

11. The enclosure system of claim 1 in which at least one module connecting device includes a fitting for gas purging the module connecting device.

12. A sealable module for an optical laser device, the sealable module comprising:
   a set of interchangeable plates and means for securing a said plate to an adjacent plate to form a module;
   at least one said plate including a window for viewing components mounted within the module; and
   at least one said plate including a port for connecting said module to another module.

13. The sealable module of claim 12 in which at least one said plate further includes a fitting for gas purging said module.

14. The sealable module of claim 12 in which said window is constructed of a material transparent to white light and opaque to ultraviolet energy.

15. The sealable module of claim 12 in which said port includes a collar for sealing a module connected device to said module.

16. The sealable module of claim 15 in which said collar includes an annular recess for housing an O-ring.

17. The sealable module of claim 12 in which at least one said plate includes means for mounting an optical device thereto.

18. A sealed laser beam enclosure system comprising:
   a first sealed module including an inlet port and an outlet port;
   a second sealed module including an inlet port and an outlet port; and
   a module connecting device sealably affixable on one end thereof the outlet port of the first module and sealably affixable on the other end thereof to the to inlet port of the second module.

19. The system of claim 18 in which said modules each include at least one window.

20. The system of claim 19 in which said window is constructed of a material transparent to white light and opaque to ultraviolet energy.

21. The system of claim 18 in which said first module further includes a fitting for gas purging said module.

22. The system of claim 21 further including a source of gas and a gas line connected to said gas fitting.

23. The system of claim 22 in which said source of gas is nitrogen.

24. The system of claim 18 in which said module connecting device is constructed of a material transparent to white light and opaque to ultraviolet energy.

25. A sealable module for optical laser devices comprising:
   a pair of spaced frame members;
   a set of legs interconnecting said frame members;
   a set of panels affixable to said frame members forming the walls of said module; and
   means for removably attaching said panels to said frame members to facilitate reconfiguration of said module.

26. The module of claim 25 in which said means for attaching includes a plurality of fasteners receivable through said panels, through said frame members, and securable with respect to said leg members.

27. The module of claim 25 in which said means for attaching includes a plurality of fasteners receivable through said panels and securable with respect to said frame members.

28. The sealable module of claim 25 in which one said panel includes a fitting for gas purging said module.

29. The sealable module of claim 25 in which one said panel includes a port.

30. The sealable module of claim 29 in which said panel further includes a collar extending outward from the periphery of said port.

31. The module of claim 30 in which said collar further includes an annular recess thereon.

32. The sealable module of claim 31 further including an O-ring fitted about said annular recess.

33. The module of claim 25 in which a said panel is fabricated of a material transparent to white light and opaque to ultraviolet energy.

34. The module of claim 23 in which a said panel includes means for mounting an optical device thereto.

* * * * *